(12) United States Patent
Matsui et al.

(10) Patent No.: US 7,860,404 B2
(45) Date of Patent: *Dec. 28, 2010

(54) OPTICAL FM SOURCE BASED ON INTRA-CAVITY PHASE AND AMPLITUDE MODULATION IN LASERS

(75) Inventors: Yasuhiro Matsui, Woburn, MA (US); Kevin McCallion, Charlestown, MA (US); Daniel Mahgerefteh, Palo Alto, CA (US); Xueyan Zheng, Andover, MA (US); Parviz Tayebati, Boston, MA (US)

(73) Assignee: Finisar Corporation, Sunnyvale, CA (US)

( * ) Notice: Subject to any disclaimer, the term of this patent is extended or adjusted under 35 U.S.C. 154(b) by 385 days.

This patent is subject to a terminal disclaimer.

(21) Appl. No.: 12/047,017

(22) Filed: Mar. 12, 2008

(65) Prior Publication Data

US 2009/0060526 A1 Mar. 5, 2009

Related U.S. Application Data

(63) Continuation-in-part of application No. 11/787,163, filed on Apr. 13, 2007, now Pat. No. 7,613,401, and a continuation-in-part of application No. 11/441,944, filed on May 26, 2006, now Pat. No. 7,492,976, and a continuation-in-part of application No. 11/272,100, filed on Nov. 8, 2005, now Pat. No. 7,477,851, and a continuation-in-part of application No. 11/037,718, filed on Jan. 18, 2005, now Pat. No. 7,536,113, and a continuation-in-part of application No. 11/084,630, filed on Mar. 18, 2005, now Pat. No. 7,406,266, and a continuation-in-part of application No. 11/068,032, filed on Feb. 28, 2005, now Pat. No. 7,555,225, and a continuation-in-part of application No. 10/308,522, filed on Dec. 3, 2002, now Pat. No. 7,663,762.

(60) Provisional application No. 60/906,333, filed on Mar. 12, 2007.

(51) Int. Cl.
*H04B 10/04* (2006.01)

(52) U.S. Cl. .................. 398/201; 398/185; 398/186; 398/187

(58) Field of Classification Search ......... 398/185–187, 398/201
See application file for complete search history.

(56) References Cited

U.S. PATENT DOCUMENTS 3,324,295 A 6/1967 Harris (Continued)

FOREIGN PATENT DOCUMENTS

GB 2 107 147 4/1983

(Continued)

OTHER PUBLICATIONS

Alexander et al., Passive Equalization of Semiconductor Diode Laser Frequency Modulation, Journal of Lightwave Technology, Jan. 1989, 11-23, vol. 7, No. 1.

(Continued)

*Primary Examiner*—Leslie Pascal
(74) *Attorney, Agent, or Firm*—Workman Nydegger

(57) ABSTRACT

An optical transmitter is discloses having a gain section and a phase section. The phase section is modulated to generate a frequency modulated signal encoding data. The frequency modulated signal is transmitted through an optical spectrum reshaper operable to convert it into a frequency and amplitude modulated signal. In some embodiments, a driving circuit is coupled to the phase and gain sections is configured to simultaneously modulate both the phase and gain sections such that the first signal is both frequency and amplitude modulated.

20 Claims, 19 Drawing Sheets

U.S. PATENT DOCUMENTS

| | | |
|---|---|---|
| 3,999,105 A | 12/1976 | Archey et al. |
| 4,038,600 A | 7/1977 | Thomas |
| 4,561,119 A | 12/1985 | Epworth |
| 4,805,235 A | 2/1989 | Henmi |
| 4,841,519 A | 6/1989 | Nishio |
| 5,293,545 A | 3/1994 | Huber |
| 5,325,378 A | 6/1994 | Zorabedian |
| 5,371,625 A | 12/1994 | Wedding et al. |
| 5,412,474 A | 5/1995 | Reasenberg et al. |
| 5,416,629 A | 5/1995 | Huber |
| 5,465,264 A | 11/1995 | Buhler et al. |
| 5,477,368 A | 12/1995 | Eskildsen et al. |
| 5,550,667 A | 8/1996 | Krimmel et al. |
| 5,592,327 A | 1/1997 | Gabl et al. |
| 5,737,104 A | 4/1998 | Lee et al. |
| 5,777,773 A | 7/1998 | Epworth et al. |
| 5,805,235 A | 9/1998 | Bedard |
| 5,856,980 A | 1/1999 | Doyle et al. |
| 5,920,416 A | 7/1999 | Beylat et al. |
| 5,953,139 A | 9/1999 | Nemecek et al. |
| 5,974,209 A | 10/1999 | Cho et al. |
| 6,081,361 A | 6/2000 | Adams et al. |
| 6,096,496 A | 8/2000 | Frankel |
| 6,104,851 A | 8/2000 | Mahgerefteh |
| 6,115,403 A | 9/2000 | Brenner et al. |
| 6,222,861 B1 | 4/2001 | Kuo et al. |
| 6,271,959 B1 | 8/2001 | Kim et al. |
| 6,298,186 B1 | 10/2001 | He |
| 6,331,991 B1 | 12/2001 | Mahgerefteh |
| 6,359,716 B1 | 3/2002 | Taylor |
| 6,473,214 B1 | 10/2002 | Roberts et al. |
| 6,506,342 B1 | 1/2003 | Frankel |
| 6,563,623 B1 | 5/2003 | Penninckx et al. |
| 6,577,013 B1 | 6/2003 | Glenn et al. |
| 6,618,513 B2 | 9/2003 | Evankow, Jr. |
| 6,654,564 B1 | 11/2003 | Colbourne et al. |
| 6,665,351 B2 | 12/2003 | Hedberg et al. |
| 6,687,278 B1 | 2/2004 | Mason et al. |
| 6,748,133 B2 | 6/2004 | Liu et al. |
| 6,778,307 B2 | 8/2004 | Clark |
| 6,810,047 B2 | 10/2004 | Oh et al. |
| 6,834,134 B2 | 12/2004 | Brennan et al. |
| 6,836,487 B1 | 12/2004 | Farmer et al. |
| 6,847,758 B1 | 1/2005 | Watanabe |
| 6,947,206 B2 | 9/2005 | Tsadka et al. |
| 6,963,685 B2 | 11/2005 | Mahgerefteh et al. |
| 7,013,090 B2 | 3/2006 | Adachi et al. |
| 7,054,538 B2 | 5/2006 | Mahgerefteh et al. |
| 7,076,170 B2 | 7/2006 | Choa |
| 7,123,846 B2 | 10/2006 | Tateyama et al. |
| 7,263,291 B2 | 8/2007 | Mahgerefteh et al. |
| 7,280,721 B2 | 10/2007 | McCallion et al. |
| 7,406,267 B2 * | 7/2008 | Mahgerefteh et al. ....... 398/201 |
| 7,555,225 B2 * | 6/2009 | Mahgerefteh et al. ....... 398/185 |
| 2002/0154372 A1 | 10/2002 | Chung et al. |
| 2002/0159490 A1 | 10/2002 | Karwacki |
| 2002/0176659 A1 | 11/2002 | Lei et al. |
| 2003/0002120 A1 | 1/2003 | Choa |
| 2003/0067952 A1 | 4/2003 | Tsukiji et al. |
| 2003/0099018 A1 | 5/2003 | Singh et al. |
| 2003/0147114 A1 | 8/2003 | Kang et al. |
| 2003/0193974 A1 | 10/2003 | Frankel et al. |
| 2004/0008933 A1 | 1/2004 | Mahgerefteh et al. |
| 2004/0008937 A1 | 1/2004 | Mahgerefteh et al. |
| 2004/0036943 A1 | 2/2004 | Freund et al. |
| 2004/0076199 A1 | 4/2004 | Wipiejewski et al. |
| 2004/0096221 A1 | 5/2004 | Mahgerefteh et al. |
| 2004/0218890 A1 | 11/2004 | Mahgerefteh et al. |
| 2005/0100345 A1 | 5/2005 | Welch et al. |
| 2005/0111852 A1 | 5/2005 | Mahgerefteh et al. |
| 2005/0175356 A1 | 8/2005 | McCallion et al. |
| 2005/0206989 A1 | 9/2005 | Marsh |
| 2005/0271394 A1 | 12/2005 | Whiteaway et al. |
| 2005/0286829 A1 | 12/2005 | Mahgerefteh et al. |
| 2006/0002718 A1 | 1/2006 | Matsui et al. |
| 2006/0018666 A1 | 1/2006 | Matsui et al. |
| 2006/0029358 A1 | 2/2006 | Mahgerefteh et al. |
| 2006/0029396 A1 | 2/2006 | Mahgerefteh et al. |
| 2006/0029397 A1 | 2/2006 | Mahgerefteh et al. |
| 2006/0228120 A9 | 10/2006 | McCallion et al. |
| 2006/0233556 A1 | 10/2006 | Mahgerefteh et al. |
| 2006/0274993 A1 | 12/2006 | Mahgerefteh et al. |

FOREIGN PATENT DOCUMENTS

| | | |
|---|---|---|
| WO | 9905804 | 2/1999 |
| WO | 0104999 | 1/2001 |
| WO | 03005512 | 7/2002 |

PUBLICATIONS

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Hyryniewicz, J.V., et al., Higher Order Filter Response in Coupled Microring Resonators, IEEE Photonics Technology Letters, Mar. 2000, 320-322, vol. 12, No. 3.

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in Microring Resonators, Integrated Photonics Research Conference 2003.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutall et al., On the Various Time Constants of Wavelength Changes of a DFB Laser Under Direct Modulation, IEEE Journal of Quantum Electronics, Oct. 1998, pp. 1816-1822, vol. 34, No. 10.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

Matsui, Yasuhiro et al, Chirp-Managed Directly Modulated Laser (CML), IEEE Photonics Technology Letters, Jan. 15, 2006, pp. 385-387, vol. 18, No. 2.

Nakahara, K. et al, 40-Gb/s Direct Modulation With High Extinction Ratio Operation of 1.3- μm InGaAlAs Multiquantum Well Ridge Waveguide Distributed Feedback Lasers, IEEE Photonics Technology Leters, Oct. 1, 2007, pp. 1436-1438, vol. 19 No. 19.

Sato, K. et al, Chirp Characteristics of 40-Gb/s Directly Modulated Distributed-Feedback Laser Diodes, Journal of Lightwave Technology, Nov. 2005, pp. 3790-3797, vol. 23, No. 11.

* cited by examiner $$\frac{\partial N}{\partial t} = \frac{I_{bias}}{e \cdot vol} - \frac{g}{1+\varepsilon S} S - BN^2 \quad \text{---Carriers}$$

$$\frac{\partial S}{\partial t} = \Gamma \frac{g}{1+\varepsilon S} S - \frac{S}{\tau_p} \quad \text{---Photons}$$

$$\frac{\partial \Phi}{\partial t} = \frac{1}{2} \Gamma \frac{dn}{dN}(N - N_{ref}) + PM \quad \text{---Phase}$$

*FIG. 4*

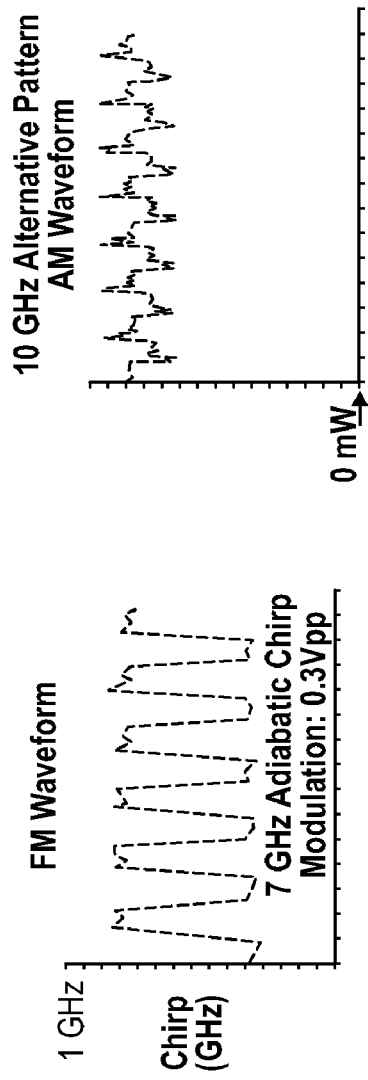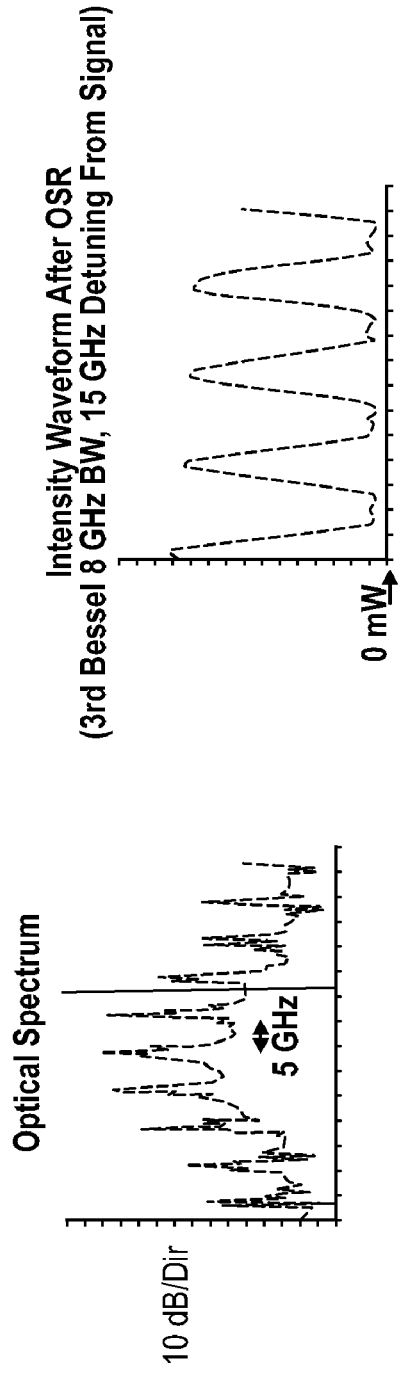
FIG. 8

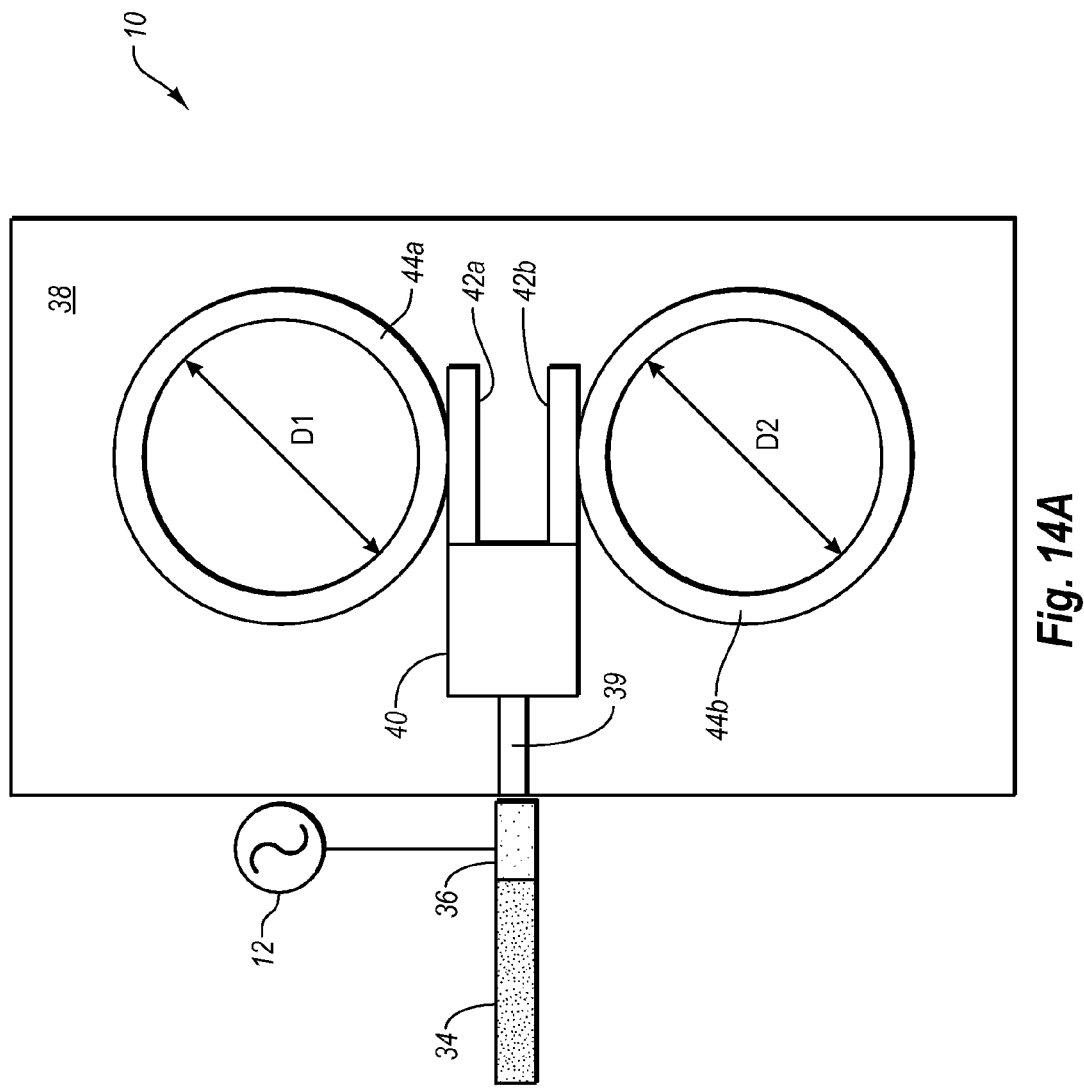

OPTICAL FM SOURCE BASED ON INTRA-CAVITY PHASE AND AMPLITUDE MODULATION IN LASERS

CROSS-REFERENCE TO RELATED APPLICATIONS

This patent application:

(i) is a continuation-in-part of pending prior U.S. patent application Ser. No. 11/272,100, filed Nov. 8, 2005 by Daniel Mahgerefteh et al. for POWER SOURCE FOR A DISPERSION COMPENSATION FIBER OPTIC SYSTEM;

(ii) is a continuation-in-part of pending prior U.S. patent application Ser. No. 10/308,522, filed Dec. 3, 2002 by Daniel Mahgerefteh et al. for HIGH-SPEED TRANSMISSION SYSTEM COMPRISING A COUPLED MULTI-CAVITY OPTICAL DISCRIMINATOR;

(iii) is a continuation-in-part of pending prior U.S. patent application Ser. No. 11/441,944, filed May 26, 2006 by Daniel Mahgerefteh et al. for FLAT DISPERSION FREQUENCY DISCRIMINATOR (FDFD);

(iv) is a continuation-in-part of pending prior U.S. patent application Ser. No. 11/037,718, filed Jan. 18, 2005 by Yasuhiro Matsui et al. for CHIRP MANAGED DIRECTLY MODULATED LASER WITH BANDWIDTH LIMITING OPTICAL SPECTRUM RESHAPER;

(v) is a continuation-in-part of pending prior U.S. patent application Ser. No. 11/068,032, filed Feb. 28, 2005 by Daniel Mahgerefteh et al. for OPTICAL SYSTEM COMPRISING AN FM SOURCE AND A SPECTRAL RESHAPING ELEMENT;

(vi) is a continuation-in-part of pending prior U.S. patent application Ser. No. 11/084,630, filed Mar. 18, 2005 by Daniel Mahgerefteh et al. for FLAT-TOPPED CHIRP INDUCED BY OPTICAL FILTER EDGE;

(vii) is a continuation-in-part of pending prior U.S. patent application Ser. No. 11/787,163, filed Apr. 13, 2007 by Yasuhiro Matsui et al. for OPTICAL FM SOURCE BASED ON INTRA-CAVITY PHASE AND AMPLITUDE MODULATION IN LASERS;

(viii) claims the benefit of U.S. Provisional Patent Application Ser. No. 60/906,333, filed Mar. 12, 2007 by Yasuhiro Matsui et al. for OPTICAL FM SOURCE BASED ON INTRA-CAVITY PHASE AND AMPLITUDE MODULATION IN LASERS.

The eight (8) above-identified patent applications are hereby incorporated herein by reference.

BACKGROUND OF THE INVENTION

1. The Field of the Invention

This invention generally relates to semiconductor laser diodes used in optical fiber communication systems, and more particularly to the frequency modulation of such laser diodes for coding data being transmitted within such fiber optic communication systems, including chirp-managed directly modulated lasers.

2. The Relevant Technology

Optical communication systems based on frequency shift keying require lasers that can generate optical frequency modulation (FM) with high efficiency and a flat response from low frequencies up to the frequency comparable to the bit rate of the transmission systems, e.g., 1 MHz to 10 GHz for a 10 Gb/s digital signal.

Direct gain modulation of a semiconductor laser is a known, simple scheme to generate FM. It generally comprises the steps of biasing the laser with a DC bias so as to provide gain to the laser, and modulating this injected current about the DC bias so as to generate the desired FM. However, this method of FM generation is very inefficient. More particularly, a measure of FM efficiency is the ratio of the peak-peak frequency modulation (also sometimes referred to as adiabatic chirp) generated to the applied modulation current or the applied modulation voltage (as the case may be). For example, for a directly modulated laser in which the laser impedance is matched to 50 Ohms, the FM efficiency is typically about 3 GHz/V. Direct gain modulation generates frequency modulation (adiabatic chirp) through the physical mechanism sometimes called gain compression, spatial hole burning, and linewidth enhancement, which generates an index change for any associated gain change in the material. All of these processes are known in the art. Furthermore, FM modulation by gain modulation through current injection leads to the heating of laser cavity, which in turn causes the lasing frequency to red shift to lower frequencies on a slow time scale. This effect is sometimes called thermal chirp and typically has a frequency response of <20 MHz associated with the thermal diffusion and dissipation time constants. Thermal chirp, which is red shifted for an increase in drive signal, counteracts the desired adiabatic chirp, which generates a blue shift for the same signal. Thermal chirp can generate pattern dependence and can increase the bit error rate (BER) of a digital transmission system such as a chirp managed laser (CML) transmitter.

The quality and performance of a digital fiber optic transmitter is determined by the distance over which the transmitted digital signal can propagate without severe distortions. The bit error rate (BER) of the signal is measured at a receiver after propagation through dispersive fiber, and the optical power required to obtain a certain BER (typically 10.sup.-12), which is sometimes called the sensitivity, is determined. The difference in sensitivity at the output of the transmitter vis-à-vis the sensitivity after propagation is sometimes called the dispersion penalty. This is typically characterized by the distance over which a dispersion penalty reaches a level of about 1 dB. A standard 10 Gb/s optical digital transmitter, such as an externally modulated source, can transmit up to a distance of about 50 km in standard single mode fiber at 1550 nm before the dispersion penalty reaches a level of about 1 dB, which is sometimes called the dispersion limit. The dispersion limit is determined by the fundamental assumption that the digital signal is transform-limited, i.e., the signal has no time-varying phase across its bits and has a bit period of 100 ps, or 1/(bit rate), for the standard 10 Gb/s transmission. Another measure of the quality of a transmitter is the absolute sensitivity after fiber propagation.

Three types of optical transmitters are presently in use in prior art fiber optic systems: (i) directly modulated lasers (DML); (ii) Electroabsorption Modulated Lasers (EML); and (iii) Externally Modulated Mach Zhender modulators (Mz). For transmission in standard single mode fiber at 10 Gb/s, and 1550 nm, it has generally been assumed that MZ modulators and EMLs can have the longest reach, typically reaching approximately 80 km. Using a special coding scheme, sometimes referred to as the phase-shaped duobinary approach, MZ transmitters can reach approximately 200 km. On the other hand, directly modulated lasers (DML) typically reach <5 km because their inherent time-dependent chirp causes severe distortion of the signal after this distance.

Recently, various systems have been developed which provide long-reach lightwave data transmission (e.g., >80 km at 10 Gb/s) using DMLs. By way of example but not limitation, systems which increase the reach of DMLs to >80 km at 10 Gb/s in single mode fiber are disclosed in (i) U.S. patent application Ser. No. 11/272,100, filed Nov. 8, 2005 by Daniel Mahgerefteh et al. for POWER SOURCE FOR A DISPERSION COMPENSATION FIBER OPTIC SYSTEM; (ii) U.S. patent application Ser. No. 11/441,944, filed May 26, 2006 by Daniel Mahgerefteh et al. for FLAT DISPERSION FREQUENCY DISCRIMINATOR (FDFD); and (iii) U.S. patent application Ser. No. 10/308,522, filed Dec. 3, 2002 by Daniel Mahgerefteh et al. for HIGH-SPEED TRANSMISSION SYSTEM COMPRISING A COUPLED MULTI-CAVITY OPTICAL DISCRIMINATOR; which patent applications are hereby incorporated herein by reference. The transmitters associated with these novel systems are sometimes referred to as Chirp Managed Laser (CML™) transmitters by Azna LLC of Wilmington, Mass. In these new CML systems, a Frequency Modulated (FM) source is followed by an Optical Spectrum Reshaper (OSR) which uses the frequency modulation to increase the amplitude modulated signal and partially compensate for dispersion in the transmission fiber. See FIG. 1, which shows a CML transmitter. In some preferred embodiments of these CML transmitters, the frequency modulated source may comprise a Directly Modulated Laser (DML). The Optical Spectrum Reshaper (OSR), sometimes referred to as a frequency discriminator, can be formed by an appropriate optical element that has a wavelength-dependent transmission function, e.g., a filter. The OSR can be adapted to convert frequency modulation to amplitude modulation.

The present invention is intended to enhance the performance of the aforementioned CML systems, among other things.

BRIEF SUMMARY OF THE INVENTION

The present invention provides a laser having a gain section and a phase section. The phase section adapted to receive a binary base signal having a bit period T. The phase section is modulated by the binary base signal to generate a first signal having frequency modulation encoding the binary base signal. An optical spectrum reshaper (OSR) receives the first signal and reshapes it into a second signal, wherein the second signal is amplitude modulated and frequency modulated.

In another aspect of the invention a driving circuit is coupled to the phase section and gain section and configured to simultaneously modulate both the phase and gain sections such that the first signal is both frequency and amplitude modulated.

In another aspect of the invention the gain and phase sections are monolithically coupled to one another.

In another aspect of the invention, the phase and gain sections are coupled to an external reflector cavity. The external cavity may include parallel resonator rings, a multi-path ring resonator, a triple coupler ring resonator a grating waveguide structure.

In another aspect of the invention the laser is a distributed feedback laser having a modulated phase section embedded in the laser cavity, such as between first and second gain sections.

In another aspect of the invention, the laser comprises a tunable twin guide sampled grating or a Y-branch distributed Bragg reflector laser.

BRIEF DESCRIPTION OF THE DRAWINGS

These and other objects, features and advantages of the present invention will be more fully disclosed or rendered obvious by the following detailed description of the preferred embodiments of the invention, which is to be considered together with the accompanying drawings wherein like numbers refer to like parts and further wherein:

FIG. 4 shows rate equations for a laser, including loss modulation by modulation of photon lifetime;

FIG. 8 illustrates AM and FM response as a function of time for loss modulation by a digital sequence of 1s and 0s;

FIG. 14A illustrates a phase modulated external cavity laser having a parallel resonator rings;

DETAILED DESCRIPTION OF THE PREFERRED EMBODIMENTS

Figure 2:
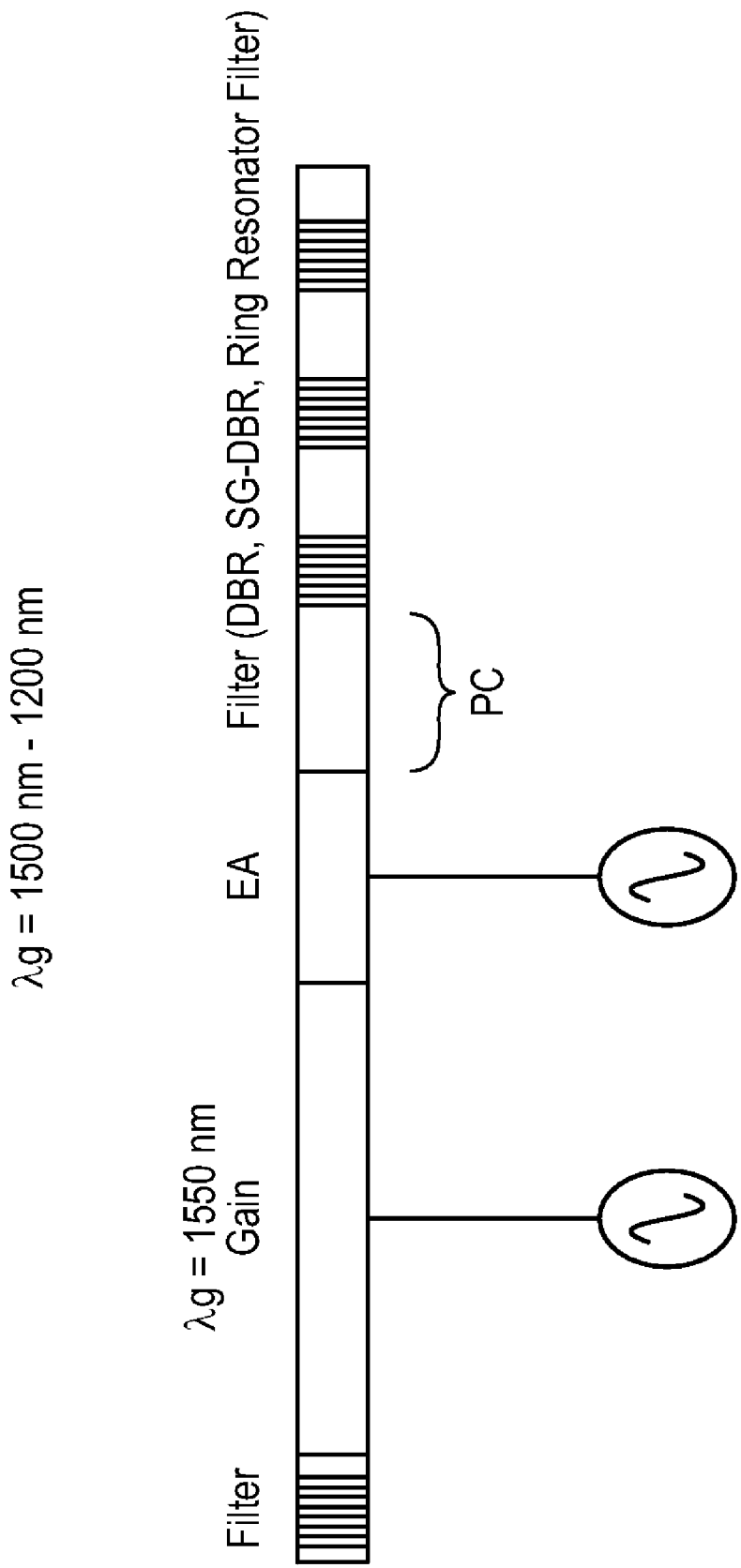
FIG. 2 is a schematic diagram showing a DBR laser having a directly modulated electro-absorption loss section in the cavity for efficient FM generation.

FIG. 2 shows one preferred embodiment of the present invention, wherein an electro-absorption (EA) modulator is integrated inside a distributed Bragg reflector (DBR) laser cavity. The EA section is reverse biased. Application of a reverse bias voltage to the EA increases cavity loss, which increases the threshold gain for lasing. This increases the threshold carrier density, which causes the laser frequency to shift towards the blue, i.e., so as to provide frequency modulation.

Figure 3:
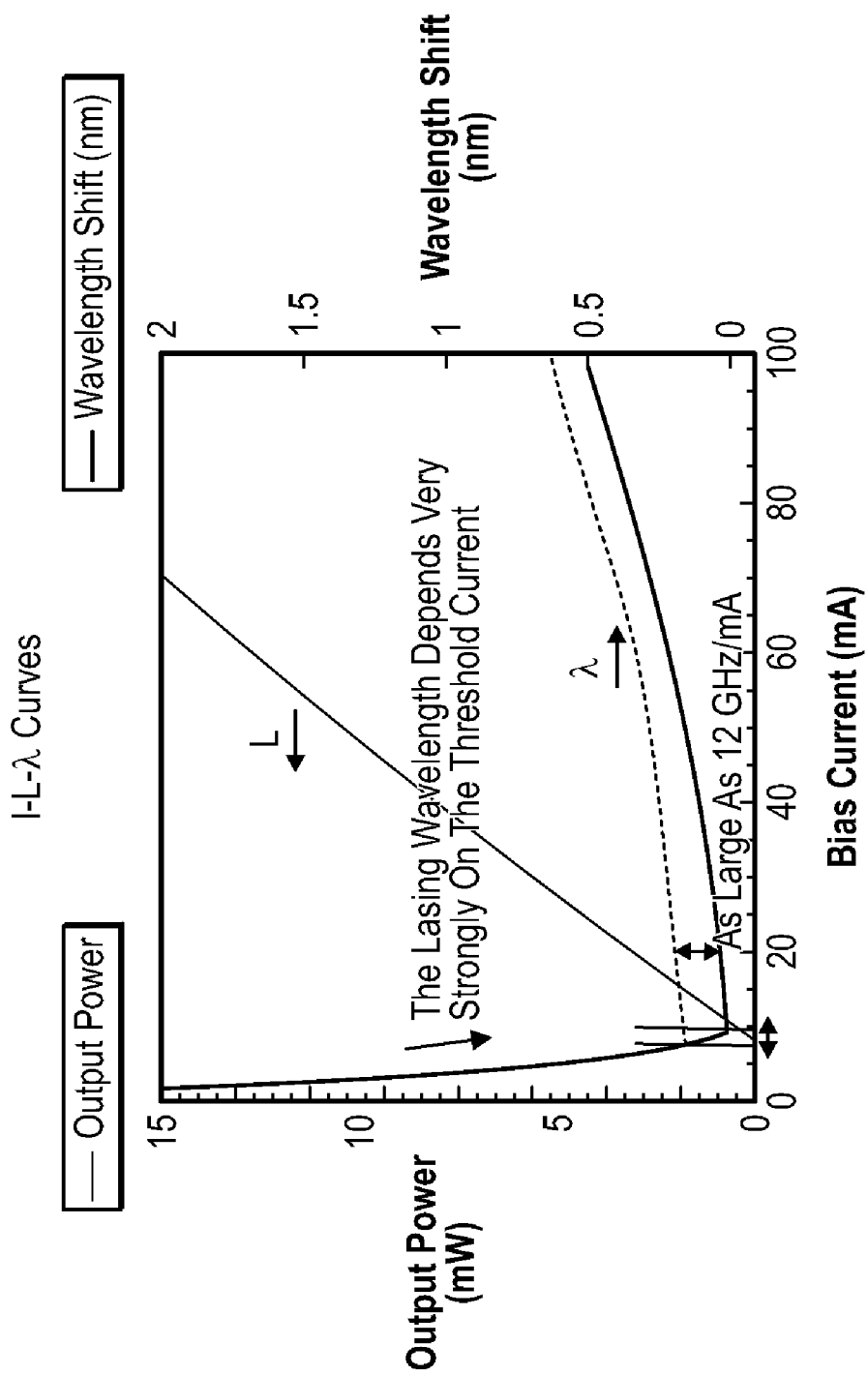
FIG. 3 shows the dependence of the lasing wavelength on threshold current and demonstrates the efficiency of using loss modulation in the laser for FM generation.

The large FM efficiency by loss modulation can be understood by considering FIG. 3, which shows the lasing wavelength as a function of injection current into a constant wave (CW) laser. It is known that the lasing wavelength of a CW semiconductor laser depends on the threshold current. Wavelength shifts to the blue as more carriers are injected into the laser below threshold. For example, the wavelength of the laser shifts by 0.2 nm (24 GHz) when the threshold current increases from 7 mA to 9 mA. This corresponds to a frequency shift efficiency of 12 GHz/mA, and indicates that intra-cavity loss modulation can be a very efficient way to generate FM in a laser.

A modification of the "standard rate equations model" for a semiconductor laser can demonstrate how loss modulation generates FM in the case of high speed modulation. FIG. 4 shows the set of rate equations for photons, carriers and phase, in which loss modulation is included by modulating the photon lifetime in the rate equation. Modulation of photon lifetime can be achieved by modulating the mirror loss of the cavity. Modulation of photon lifetime is one of several methods for modulating the intra-cavity loss of a laser to generate the desired FM modulation. Other methods are also available, e.g., mirror loss modulation, intra-cavity loss modulation using a saturable absorber, etc. Thus, photon lifetime modulation is used here in the rate equations in order to illustrate the result of loss modulation on the AM and FM response of a laser, but is not intended to indicate that only one such method is available.

Figure 5:
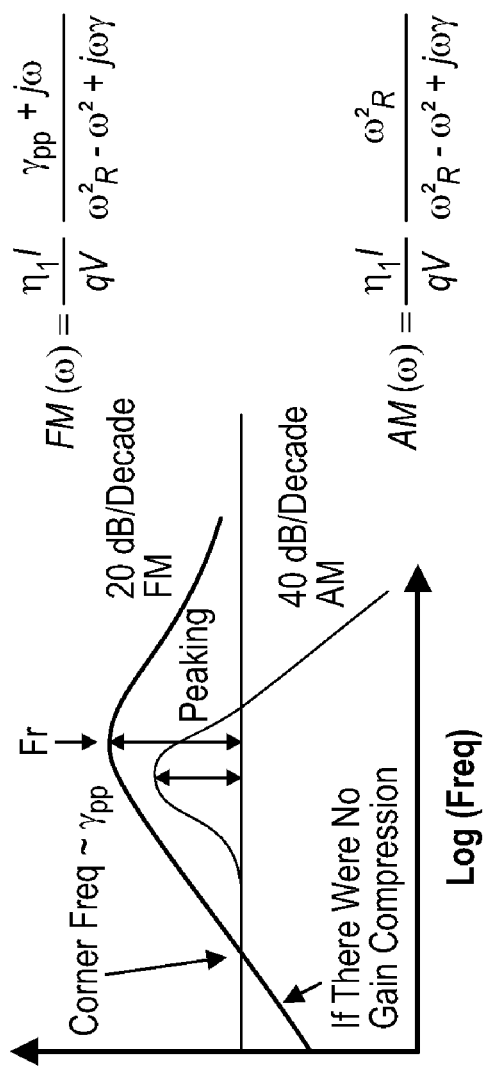
FIG. 5 illustrates AM and FM response for conventional gain modulation.

In order to elucidate the difference between conventional gain modulation and the loss modulation approach of the present invention, we can compare the small signal frequency response solutions of the rate equations for the two cases (i.e., conventional gain modulation and the loss modulation approach of the present invention). FIG. 5 describes the small signal frequency response to the rate equations for conventional high speed gain modulation of laser diodes, which produces amplitude modulation (AM) and frequency modulation (FM). As is known in the art, the AM response shows a peak at slightly lower frequency than a characteristic relaxation oscillation frequency, $f_r$, with a peak height of about 4 dB. The response rolls off beyond $f_r$ at a rate of 40 dB/decade. The FM response shows the peaking exactly at $f_r$ with a peak response of about 10 dB. The response rolls off beyond $f_r$ at a rate of 20 dB/decade. Therefore, with conventional current modulation of a laser diode, FM has a higher effective bandwidth.

Figure 6:
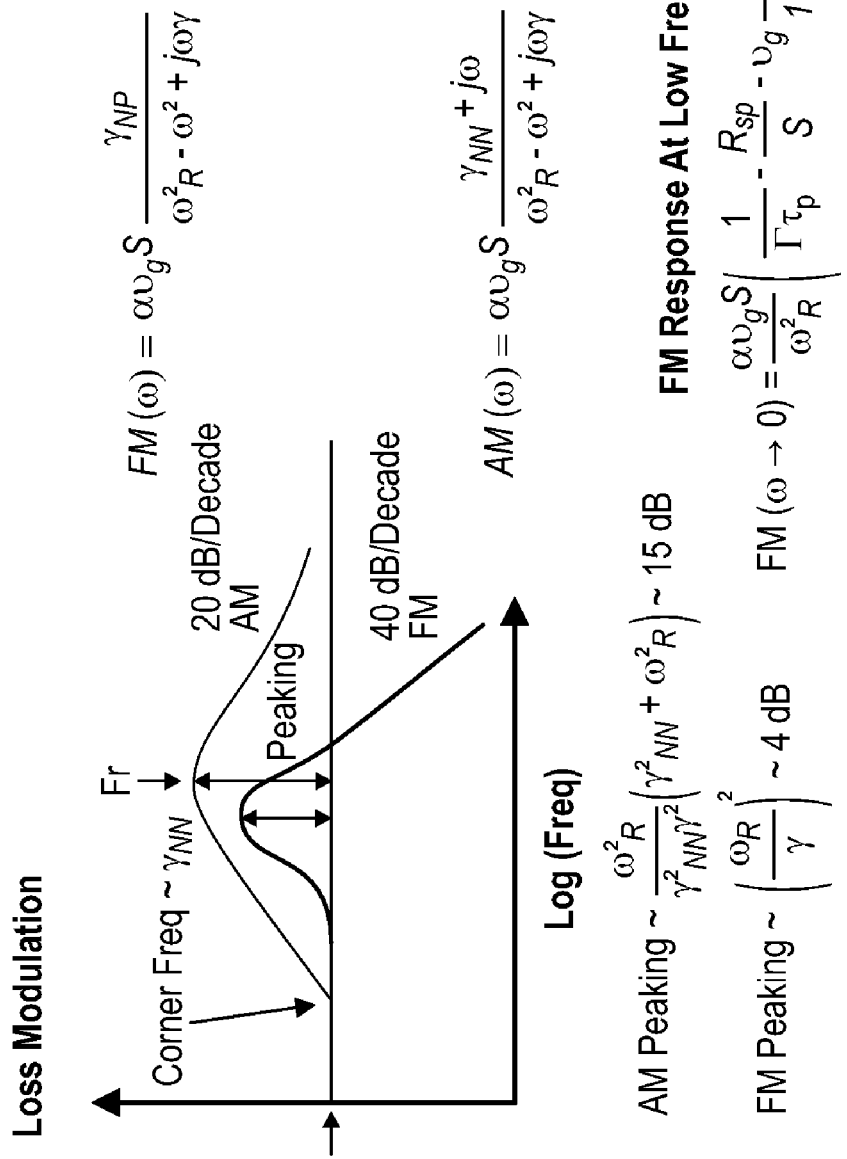
FIG. 6 illustrates AM and FM response for loss modulation.

In contrast, FIG. 6 shows the AM and FM response for intra-cavity loss modulation of a laser diode. In this case, the frequency response of AM and FM show reversed trends compared to that for conventional gain modulation. The AM response shows peaking at $f_r$ with a peak height of about 15 dB, and rolls off beyond $f_r$ at a rate of 20 dB/decade. The FM response shows a peak at a slightly lower frequency than $f_r$, with a peak response of about 4 dB. The response rolls off beyond $f_r$ at a rate of 40 dB/decade. Therefore, an enhancement in AM modulation bandwidth is expected for the intra-cavity loss modulation scheme, while FM modulation bandwidth will be lower than that for current modulation.

In another embodiment of the present invention, the FM response is enhanced by the addition of intra-cavity phase modulation.

Figure 7:
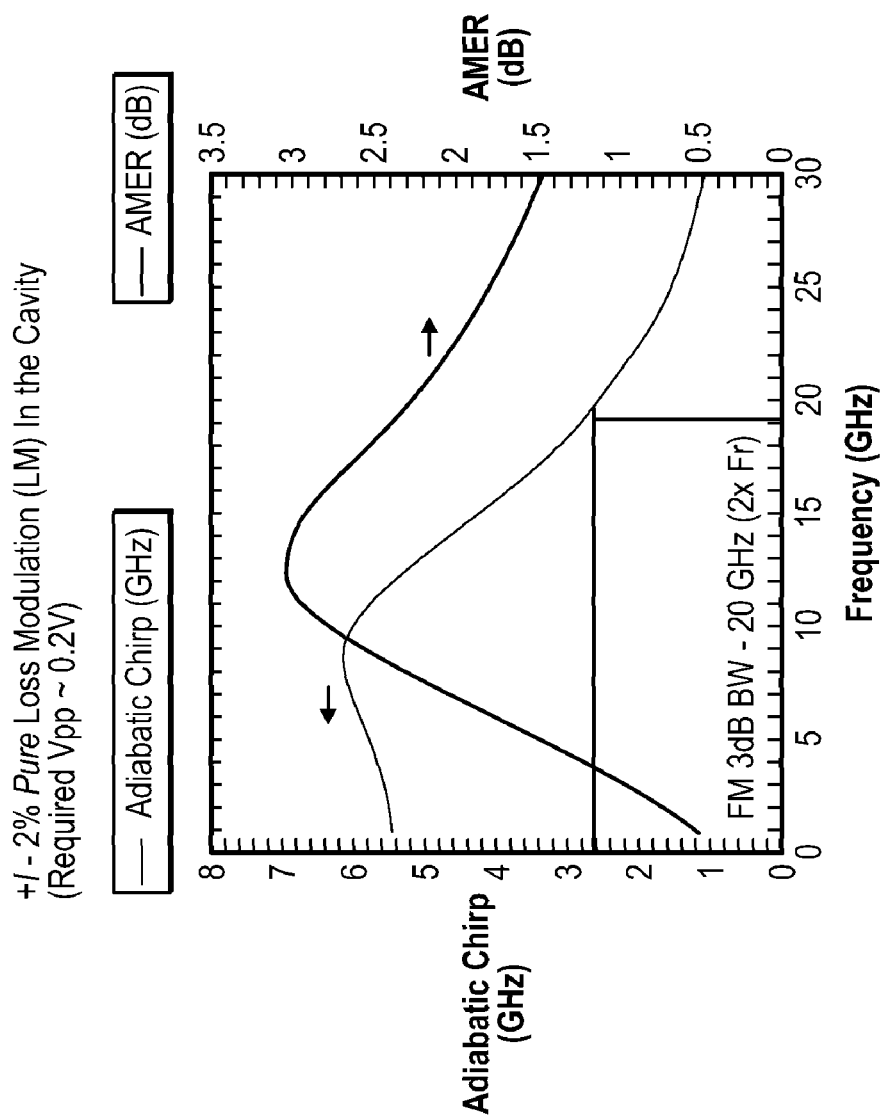
FIG. 7 illustrates AM and FM response for a +/−2% modulation of intra-cavity loss.

FIG. 7 shows the AM and FM response for +/−2% modulation in the intra-cavity loss. The corresponding modulation voltage for a typical EA modulator is about 0.2 Vpp. As the small signal analysis of the rate equation shows, the FM response shows relatively flat response up to the characteristic frequency $f_r$. The FM efficiency is as large as 5 GHz for the small modulation of 0.2 Vpp to the EA modulator section. The AM response shows the large peaking around $f_r$.

In one preferred embodiment of the present invention, the loss modulated FM source is used as the source in a chirp managed laser (CML), together with an optical spectrum reshaper (OSR) filter, as described in (i) U.S. patent application Ser. No. 11/037,718, filed Jan. 18, 2005 by Yasuhiro Matsui et al. for CHIRP MANAGED DIRECTLY MODULATED LASER WITH BANDWIDTH LIMITING OPTICAL SPECTRUM RESHAPER; (ii) U.S. patent application Ser. No. 11/068,032, filed Feb. 28, 2005 by Daniel Mahgerefteh et al. for OPTICAL SYSTEM COMPRISING AN FM SOURCE AND A SPECTRAL RESHAPING ELEMENT; and (iii) U.S. patent application Ser. No. 11/084,630, filed Mar. 18, 2005 by Daniel Mahgerefteh et al. for FLAT-TOPPED CHIRP INDUCED BY OPTICAL FILTER EDGE; which patent applications are hereby incorporated herein by reference.

FIG. 8 shows an example of modulation by a digital sequence, in which both AM and FM responses of a loss modulated laser are shown. FIG. 8 also shows the optical spectrum as well as the amplitude waveform after the signal has passed through an optical spectrum reshaper (OSR) filter, as prescribed in the chirp managed laser (CML) patent documents identified above. Among other things, the FM-to-AM conversion by the OSR filter increases the amplitude extinction ratio of the resulting signal.

Figure 9:
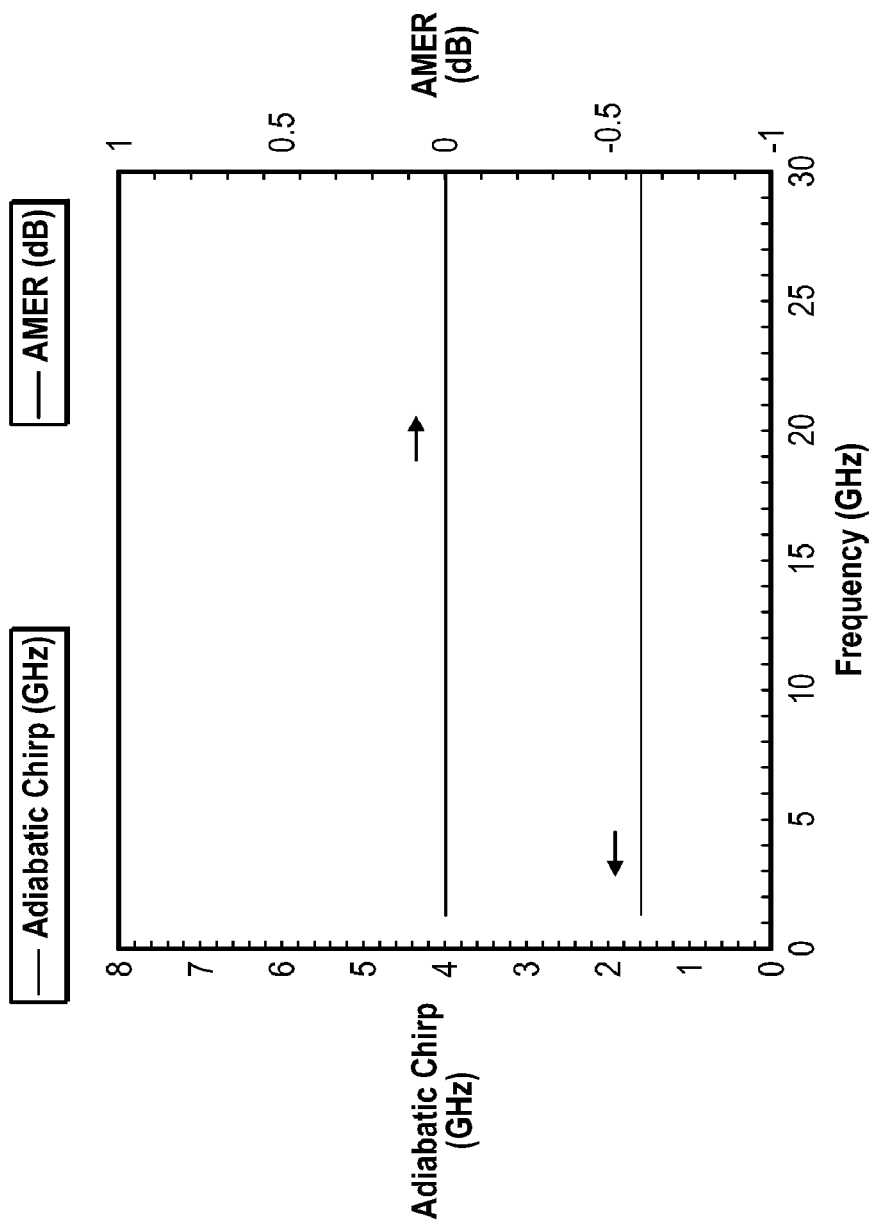
FIG. 9 illustrates AM and FM response for pure intra-cavity phase modulation.

In another embodiment of the present invention, and looking now at FIG. 9, only the phase is modulated inside the cavity. In this case, there is no AM modulation since gain is not affected, and the FM response can intrinsically be flat and only limited by the RC roll-off of the modulated section. As is evident in the rate equations, the phase of FM changes from 0 to π/2 as the modulation frequency is swept from DC beyond $f_r$. Since there is no timing delay between the modulation signal and the FM response generated by pure phase modulation in the cavity, the relative delay between loss-modulation induced FM and that induced by pure phase modulation changes with modulation frequency. At low frequencies, both are π out of phase, since the sign of FM by loss modulation and phase modulation are opposite, assuming that the QCSE (or Franz-Keldysh) effect is used to generate phase modulation.

Figure 10:
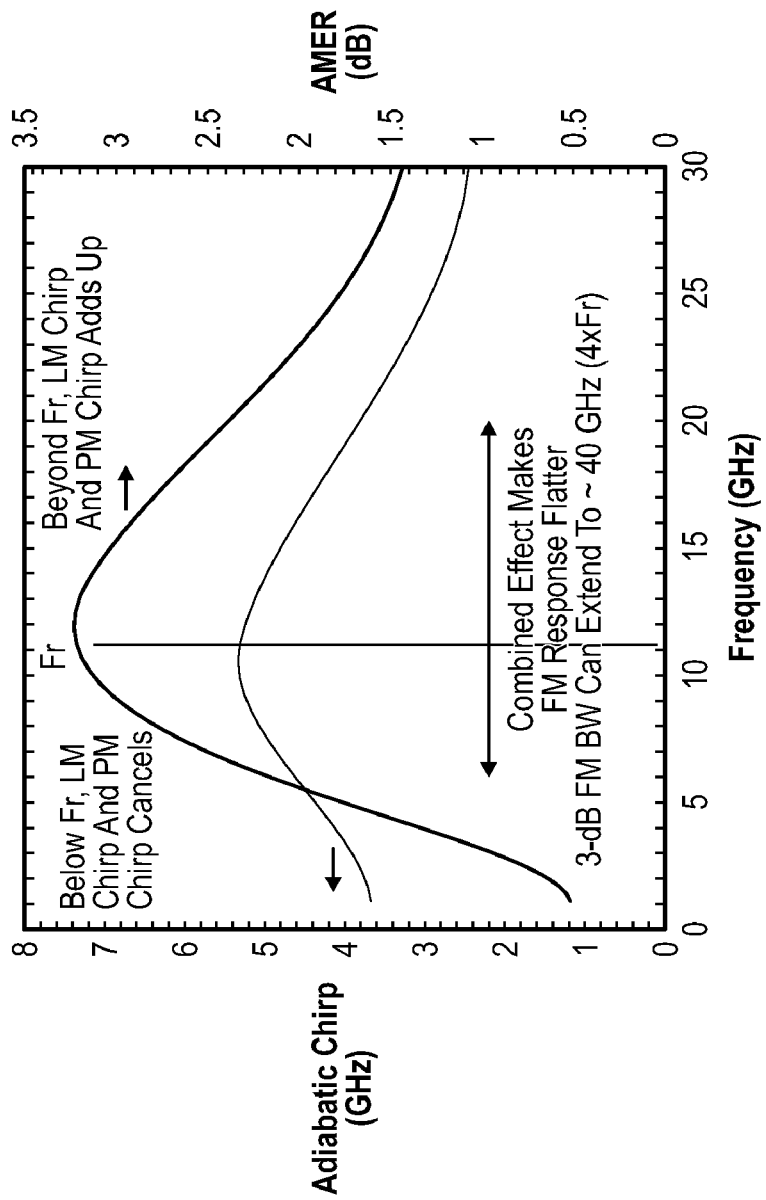
FIG. 10 illustrates AM and FM response for simultaneous intra-cavity loss and phase modulation.

FIG. 10 shows the case where both intra-cavity loss and phase modulation (which can be induced, for example, by reverse bias modulation in an EA section) are present. At low frequencies, the FM response drops as a result of competition between loss modulation and phase modulation in the EA section. At frequencies higher than $f_r$, the two effects add up so as to improve the FM response. It is, therefore, possible to design the FM response with a reasonably flat response up to approximately 40 GHz.

A variety of mechanisms can be used to induce modulation of loss in the cavity of a laser. These include, but are not limited to, (i) the quantum confined stark effect (QCSE); (ii) the Pockels effect; and (iii) the Franz-Keldysh effect. These are all different manifestations of a change in the absorption or index characteristics of a semiconductor material by the application of a voltage to the material, and are known in the art.

Intra-cavity loss modulation can be applied to a variety of monolithic laser designs. By way of example but not limitation, these include (i) distributed feedback (DFB) lasers; (ii) distributed Bragg reflector (DBR) lasers; (iii) sampled grating distributed Bragg reflector (SG-DBR) lasers; and (iv) Y branch DBR lasers. In each case, a new loss section of the laser needs to be added (e.g., an EA section or a saturable absorber section) in order to induce loss in the cavity. Alternatively, the mirror loss can be modulated in each case.

Other lasers can also be loss modulated so as to generate the desired FM. These include, but are not limited to, (i) external cavity lasers such as external cavity lasers with fiber Bragg gratings, ring resonators, planar lightwave circuit (PLC) Bragg gratings, arrayed waveguide gratings (AWG), and grating filters as external cavities; (ii) vertical cavity surface emitting lasers (VCSEL); and (iii) Fabry Perot lasers. All of the foregoing lasers, as well as other lasers, can also be loss modulated so as to generate the desired FM.

Referring to FIGS. 11 through 19, various laser cavity designs may be used to accomplish FM modulation using a phase modulator in the laser cavity. Conventional FM modulation by direct modulation of semiconductor laser diodes relies on the gain compression and associated imperfect clamping of the carrier density in the gain medium. This typically leads to a FM modulation efficiency of ~250 GHz/mA. The modulation bandwidth of FM modulation is slightly wider than that for AM modulation by direct modulation of laser. However still limited by the relaxation oscillation frequency of the laser.

An FM modulation scheme in accordance with embodiments of the present invention is based on the incorporation of an electro-optic (EO) phase modulator in the cavity. In the proposed FM modulation scheme, the EO effect in reverse biased phase modulator can create refractive index modulation of typically 0.1%. Assuming a typical optical confinement factor of 0.15 in the vertical direction and 0.2 in the longitudinal direction, the estimated FM modulation efficiency is 2 GHz/V. Further increase in the FM efficiency is achievable by increasing the length of the phase modulator. The limitation on modulation bandwidth is set by the RC cut-off frequency where C is the parasitic capacitance and R is the 50 ohm matching resistivity. The limitation by the parasitic capacitance can be removed by the design of a high-speed traveling wave electrode having effective 50 ohm impedance for the given C.

The advantage of high FM modulation bandwidth for the EO modulation in phase section of laser provides a path for wide bandwidth high FM modulation efficiency for the external cavity laser for tunable applications based on various filter types, such as a ring resonator, Bragg grating on PLC or fiber, DBR, SG-DBR, MG-Y. For the counterpart of direct modulation of gain region, on the other hand, the effective differential gain is reduced by a fraction of gain section with respect to the total cavity a length, and thus reduced the modulation bandwidth as well as FM modulation efficiency.

The bandwidth of modulation for the reverse bias scheme to a passive laser section based on Pockels/Franz Keldysh/Wannier-Stark/QCSE effects is not limited by the differential gain, which is effectively reduced for the extended cavity laser by a factor defined for the fraction of active section to the total cavity length. In embodiments of the present invention, high speed modulation is achievable for long cavity DBR lasers and external cavity lasers with external ring resonator filters or Bragg gratings on a fiber or planar lightwave circuit (PLC).

Figure 11:
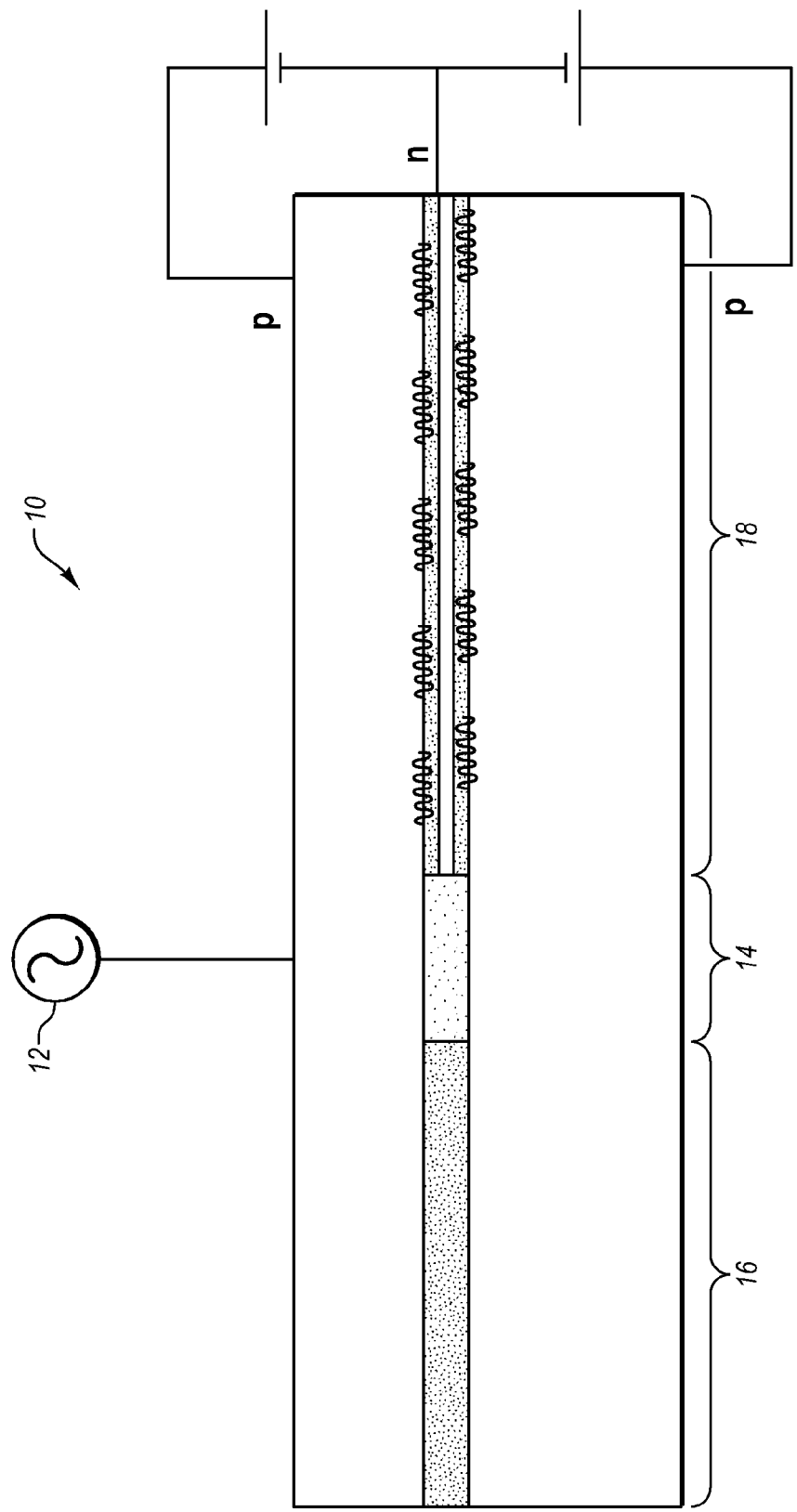
FIG. 11 illustrates a tunable twin guide sampled grating (TT-SG) distributed Bragg reflector (DBR) having intra-cavity phase modulation.

Referring specifically to FIG. 11, a laser 10 may be embodied as a tunable twin guide sampled grating distributed Bragg reflector (TTG-SG-DBR) laser. A modulation signal source 12 is applied to a passive phase section 14 of TTG-SG-DBR laser as shown. The laser 10 further includes a gain section 16 and a TTG section 18. The TTG section consists of two waveguides, each of which has slightly different grating pitch in order to exploit the Vernier effect for tuning of the laser.

Figure 12:
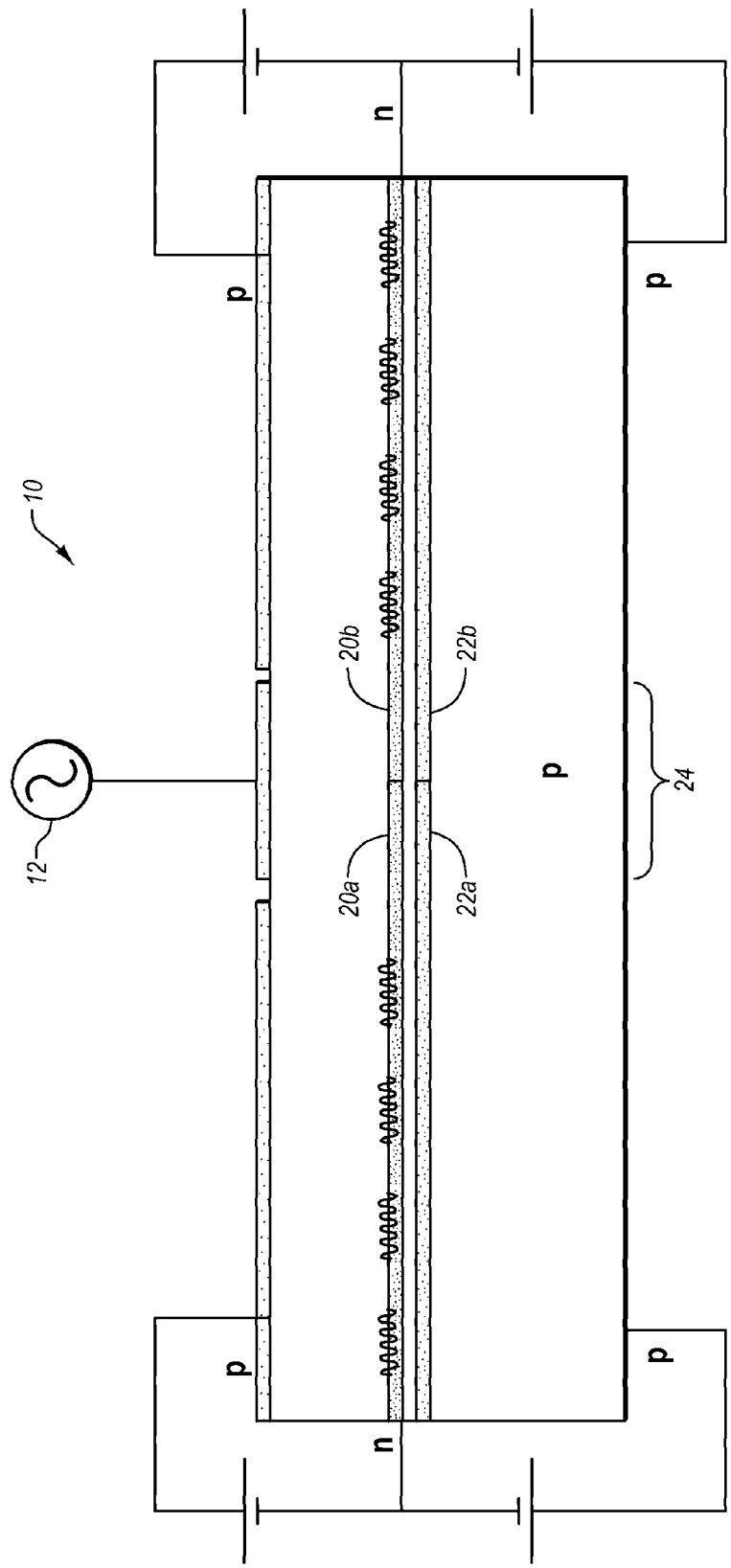
FIG. 12 illustrates a TT-SG distributed feedback (DFB) laser having intra-cavity phase modulation.

Referring to FIG. 12, in an alternative embodiment, a laser 10 is embodied as a two section TTG-DFB laser as shown, having two DFB waveguide sections 20a, 20b extending along gain sections 22a, 22b. In the illustrated embodiment, the phase modulated section 24 is positioned between the gain sections 22a, 22b in the same optical path as the gain sections 22a, 22b. However, the position of the phase modulated section 24 may be located at other positions within the laser cavity. The phase modulated section 24 is coupled to a modulation signal source 12.

Figure 13:
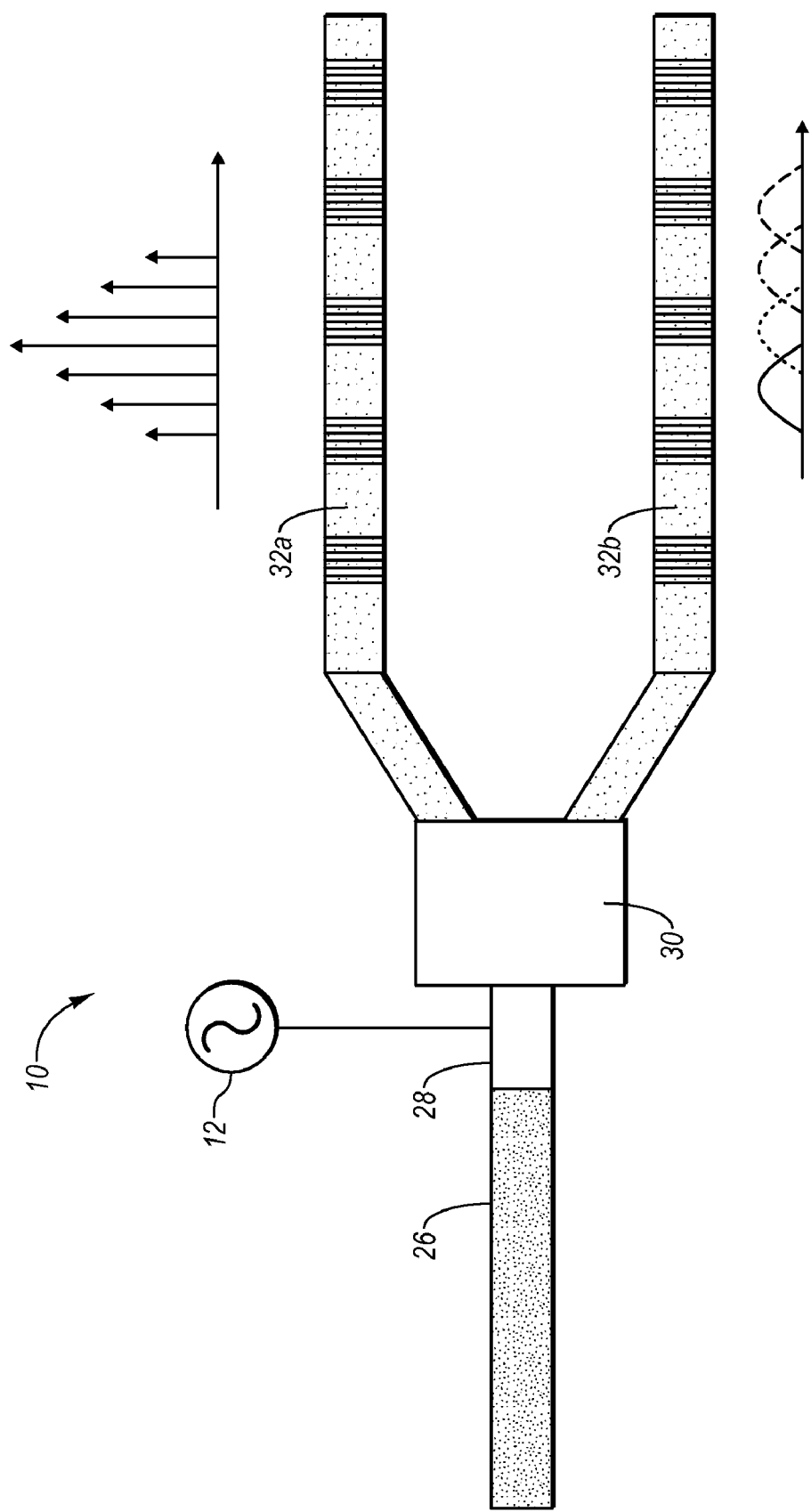
FIG. 13 illustrates a phase modulated Y-branch laser.

Referring to FIG. 13, in another alternative embodiment, the laser 10 is embodied as a Y-branch laser having a gain section 26 and a phase modulated section 28 coupled to a multi-mode interface (MMI) 30. A modulation signal 12 is applied to one or both of the phase modulated section 28 and MMI 30. Two gratings 32a, 32b are coupled to the MMI to enable tuning using the Vernier effect. The gratings 32a, 32b may both be sampled gratings, or one of the gratings 32a, 32b may be a phase grating.

Referring to FIGS. 14A-14D, in another alternative embodiment, the laser 10 is embodied as an external cavity laser having a gain section 34 and phase modulated section 36 optically coupled to a separate chip 38. The gain section 34 may be monolithically integrated with the phase modulated section 36 in another semiconductor chip. The chip 38 may be embodied as a flip-chip in passive alignment with either the phase modulated section 36 or gain section 34. The phase modulated section is coupled to a modulation signal source 12.

Referring specifically to FIG. 14A, the chip 38 may include an inlet waveguide 40 coupled to an MMI 40. Two waveguides 42a, 42b are coupled to the MMI. Each waveguide 42a, 42b is coupled to a resonator ring 44a, 44b. The resonator rings 44a, 44b preferably have different radii D1, D2 to enable tuning using the Vernier effect. Configuring the two resonator rings 44a, 44b in parallel reduces the effective length of the external cavity, and therefore improves the intrinsic modulation bandwidth of the laser 10

Figure 14B:
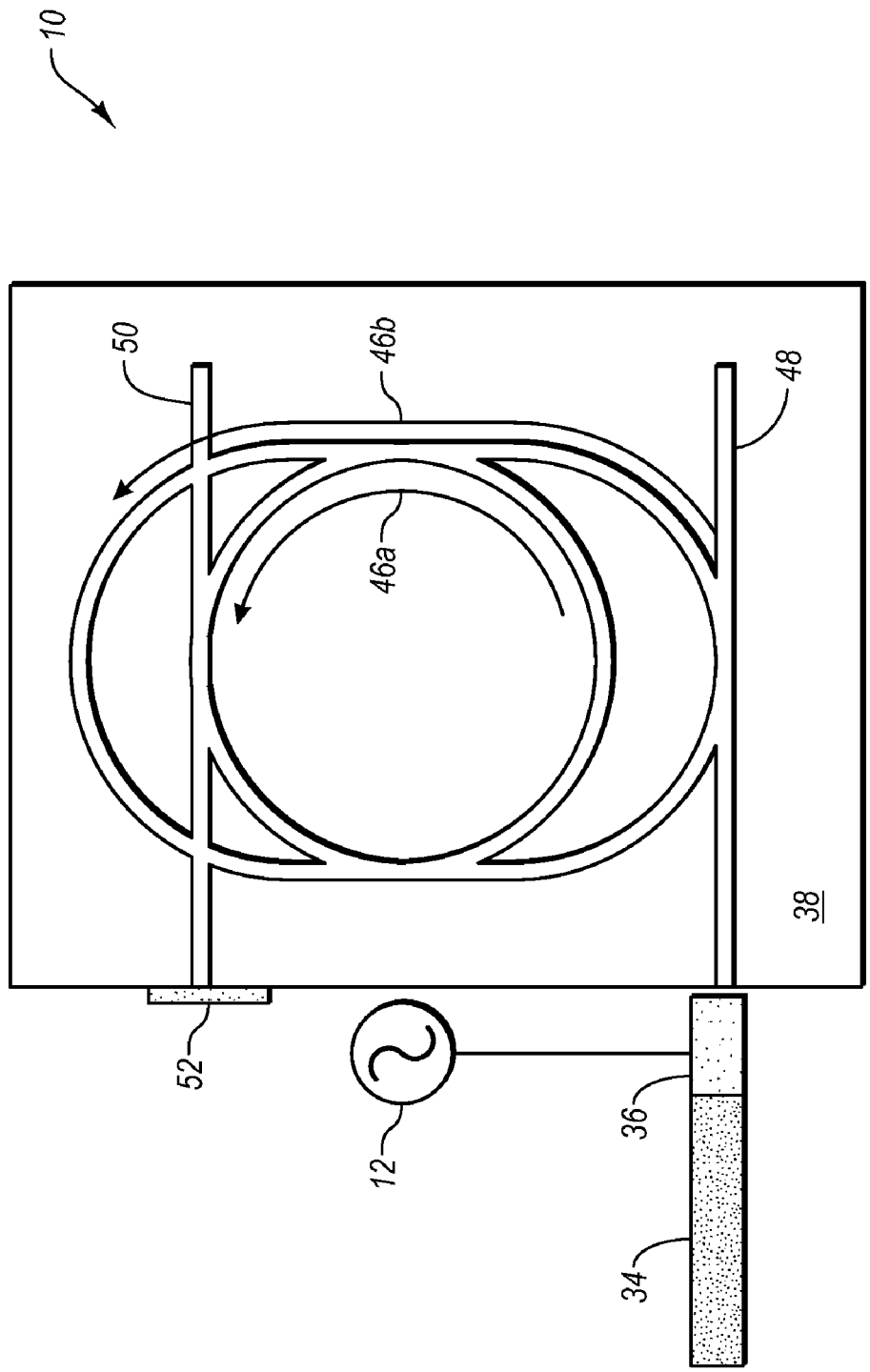
FIG. 14B illustrates a phase modulated external cavity laser having a multi-path ring resonator.

Referring to FIG. 14B, in another alternative embodiment, the chip 38 includes a multi-path resonator ring reflector. The chip 38 defines two paths 46a, 46b having lengths $\Lambda_1$ and $\Lambda_2$. The paths 46a, 46b are coupled to one another to define a third path having a length $\Lambda_3=(\Lambda_1+\Lambda_2)/2$. Path 46a is coupled to an input waveguide 48 and path 46b is coupled to an output waveguide 50. The input waveguide 48 receives light from the gain section 34 and phase modulated section 36. A highly reflective surface 52 is formed at one end of the output waveguide 50 to reflect light back through the multi-path resonator ring reflector.

The free spectral range (FSR) of the multi-path resonator ring reflector of FIG. 14B is determined according to the equation $FSR=N \times FSR_1=M \times FSR_2$, where $\Lambda_2=(M/N)\Lambda_1$, L=M+N. $FSR_1$ is the free spectral range of the first path 46a and FSR2 is the free spectral range of the second path 46b. By using the two different path lengths for the circulation in the rings, the Vernier effect can be exploited without increasing external cavity length compared to the case of two serial rings.

Figure 14C:
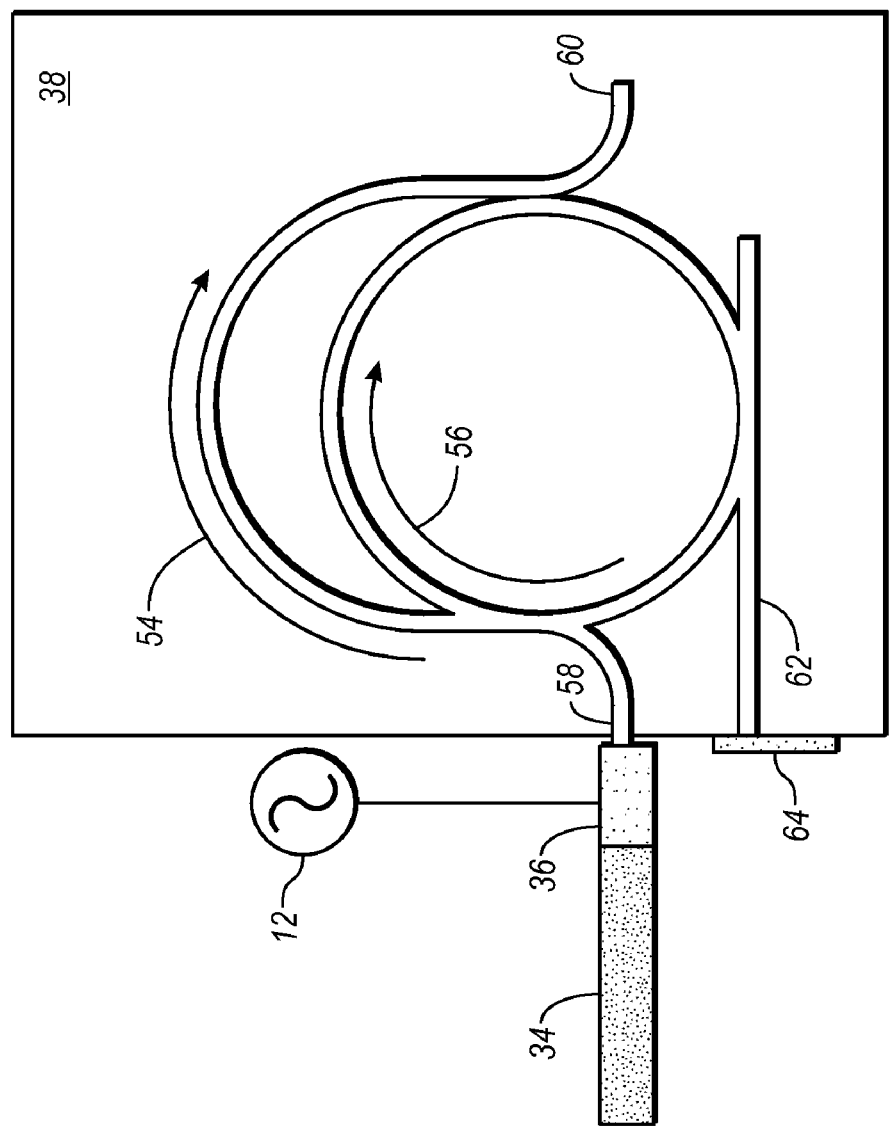
FIG. 14C illustrates a phase modulated external cavity laser having a triple coupler ring resonator.

Referring to FIG. 14C, in another alternative embodiment the chip 38 includes a triple coupler ring reflector. The embodiment of FIG. 14C provides a simplified version of the multi-path ring laser, while still enabling use of the Vernier effect for tuning. Compared to multi-path ring lasers, the triple coupler ring laser offers low cross talk between adjacent reflection peaks.

The chip 38 includes a first path 54 and a second path 56. The second path 56 is circular and is coupled to the first path 54 at points K1 and K2. A first end 58 of the first path 54 receives light from the gain section 34 and phase modulated section 36. A second end 60 of the first path 54 emits light into the chip 38. An output waveguide 62 is coupled to the second path 56 and has one end coupled to a highly reflective surface 64.

Figure 14D:
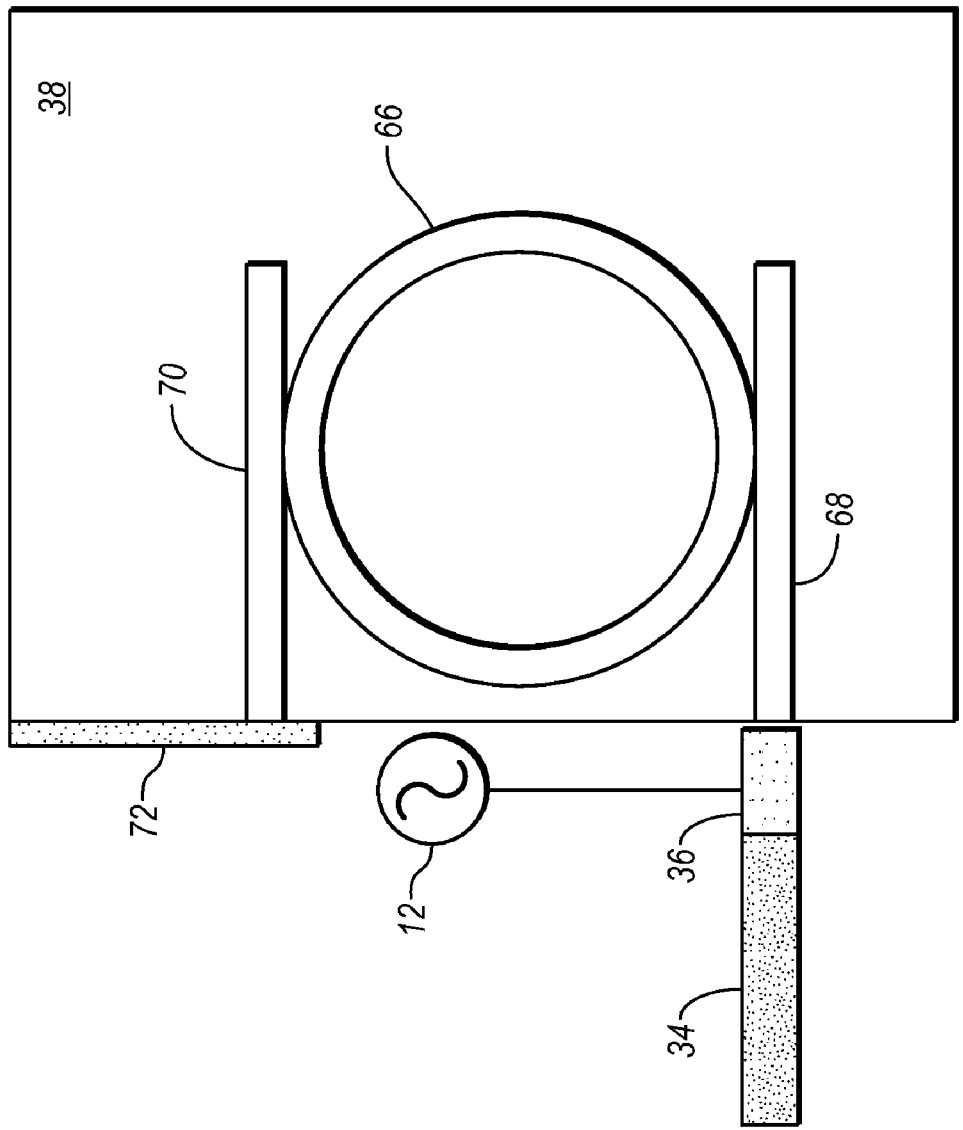
FIG. 14D illustrates a phase modulated external cavity laser having a single resonator ring.

Referring to FIG. 14D, in another alternative embodiment, the chip 38 includes a single ring resonator 66. An input waveguide 68 is coupled to the ring resonator 66 and to the gain section 34 and phase modulated section 36. An output waveguide 70 is also coupled to the ring resonator 66 and has one end coupled to a highly reflective surface 72.

Polymer based material can be used for the waveguides in the chip 38 to enable high index change by temperature (4×10⁻⁴/° C.) for tuning by heating. The diameter of the ring resonator 66 may be chosen to minimize the radiation loss for the propagation of light in the ring, which is determined by the refractive index difference between the waveguide material and the chip 38. As an example, the minimum diameter for low loss ring for Polymide (Δn~22%) will be 10 μm (FSR~20 nm). In this case, the limited spectral bandwidth of the gain media can be used for selecting the single mode from the multiple reflection peaks for the ring resonator 66 separated by 20 nm.

Figure 15:
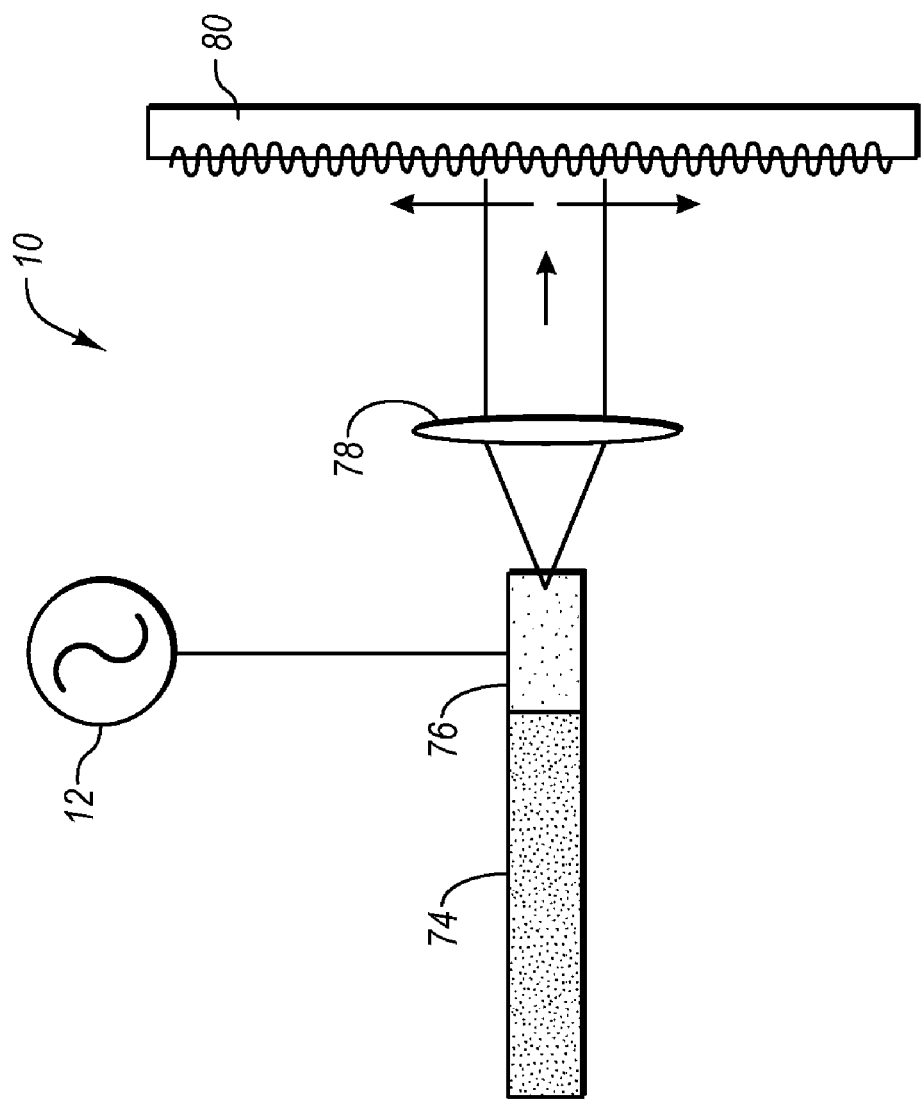
FIG. 15 illustrates a phase modulated external cavity laser having a grating waveguide structure.

Referring to FIG. 15, in another alternative embodiment, a laser 10 includes a gain section 74 and a phase modulated section 76, having the phase modulated section 76 coupled to modulation signal source 12. Light emitted from the gain section 74 and phase modulated section 76 is passed through a collimating lens 78. The collimating lens 78 directs a collimated light beam onto a grating waveguide structure (GWS) 80. The laser 10 of FIG. 15 may be tuned by changing the angle of the GWS to select which wavelengths are reflected back into the gain section 74.

Figure 16:
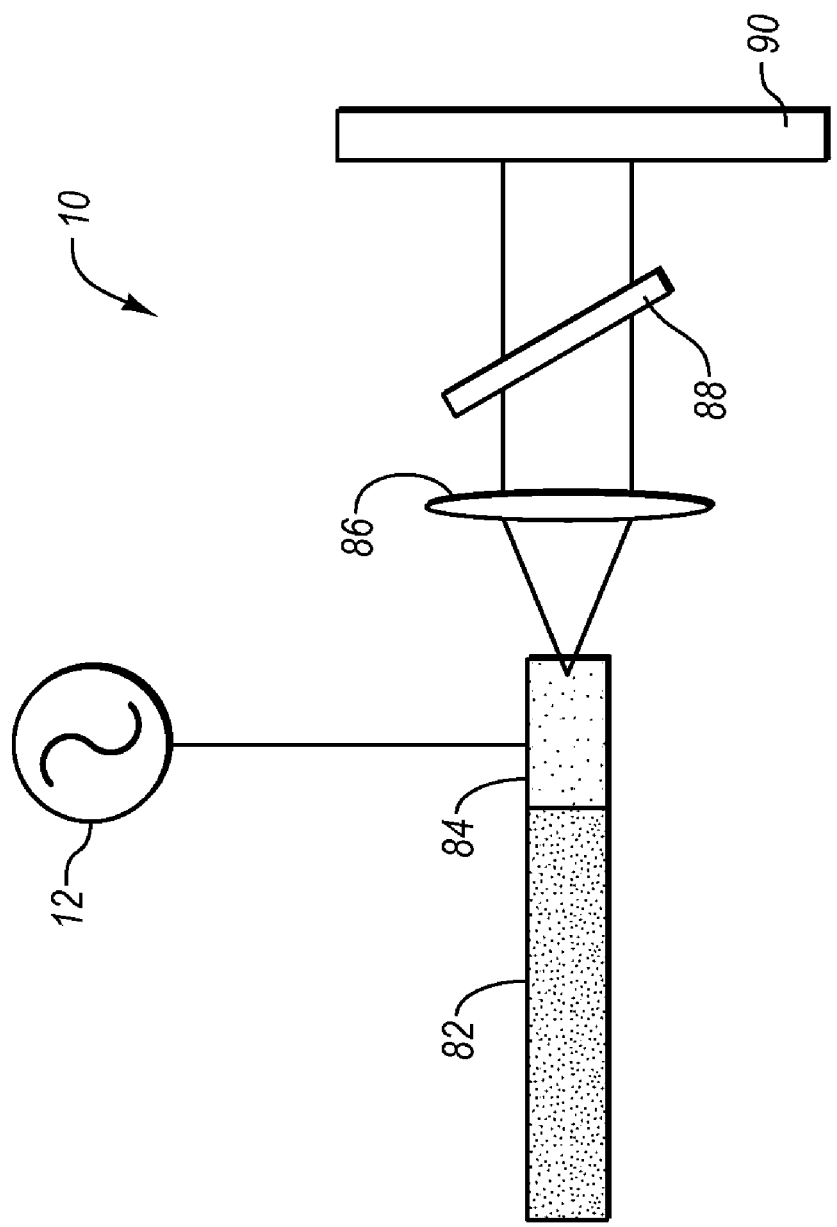
FIG. 16 illustrates a phase modulated external cavity laser having an etalon filter.

Referring to FIG. 16, in another alternative embodiment, a laser 10 includes a gain section 82 and a phase modulated section 84, having the phase modulated section 84 coupled to a modulation signal source 12. Light emitted from the gain section 82 and phase modulated section 84 is passed through a collimating lens 86. The collimating lens 86 directs a collimated light beam through an etalon filter 88 onto a mirror 90. The etalon filter 88 selects which wavelengths will be emitted by the laser 10. In the illustrated embodiment, wavelengths that transmit through the etalon 88 will be reflected back to the gain section 82, whereas wavelengths reflected by the etalon 88 will be directed away from the gain section 82. The etalon 88 may be tuned by means of an index change induced by a change in temperature.

In the above described embodiments of FIGS. 11-15, the modulation signal source 12 encodes data such that the when it is applied to the phase modulation section, a frequency shift keyed (FSK) signal encoding data results. In some embodiments, the gain section is simultaneously modulated in order to generate a signal that is both amplitude shift keyed (ASK) and FSK. In such embodiments, the AM and FM sidebands may be cancelled on the low frequency side to produce a single-sideband signal directly from the laser 10. For example, the OSR may have a transmission function chosen to cancel one of the side bands of the frequency modulated signal.

Figure 1:
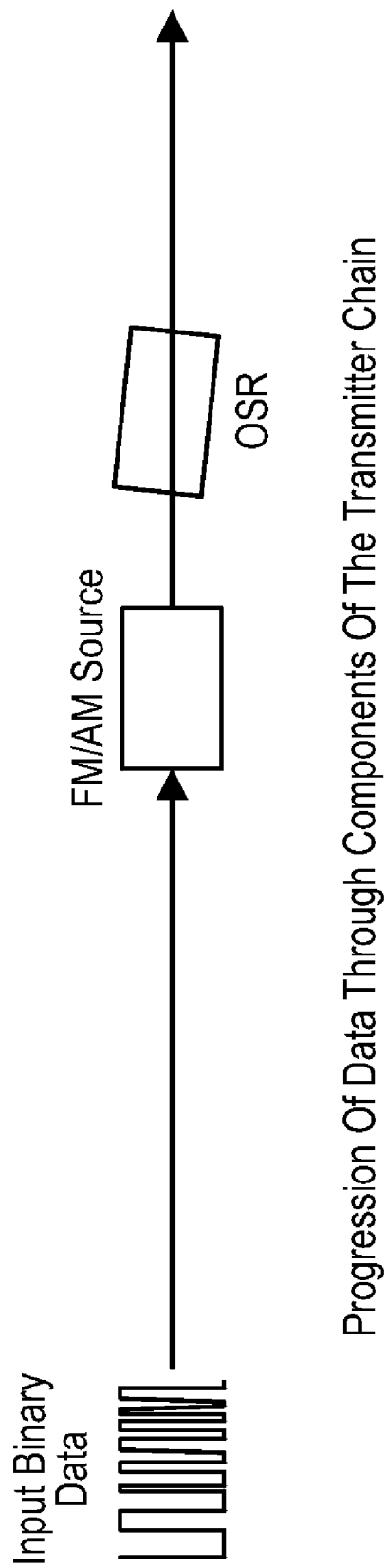
FIG. 1 is a schematic diagram showing a chirp managed laser transmitter.

The lasers 10 of FIGS. 11-16 may be used as the FM/AM source in the transmitter of FIG. 1. The OSR in such embodiments preferably has a transmission function chosen such that at least a portion of the frequency modulation resulting from modulation of the phase modulation section is converted into amplitude modulation. In some embodiments, the OSR has a 3 dB bandwidth between 0.5 and two times 1/T, where T is the bit rate of a data signal modulating the laser, as outlined in U.S. patent application Ser. No. 11/037,718, filed Jan. 18, 2005 by Yasuhiro Matsui et al. for CHIRP MANAGED DIRECTLY MODULATED LASER WITH BANDWIDTH LIMITING OPTICAL SPECTRUM RESHAPER.

In another embodiment, the frequency modulation of the phase section results in frequency excursions between a base frequency and a peak frequency, with the frequency excursions encoding a data signal. In some embodiments the difference between the base and peak frequency is between 0.25 and 0.75 times 1/T as explained in U.S. patent application Ser. No. 11/068,032, filed Feb. 28, 2005 by Daniel Mahgerefteh et al. for OPTICAL SYSTEM COMPRISING AN FM SOURCE AND A SPECTRAL RESHAPING ELEMENT.

The modulation of the phase section in the lasers 10 of FIGS. 11-16 can be used to compensate for fiber dispersion at the transmitter. For example, $3^{rd}$ order dispersion in a transmission fiber can be compensated by sinusoidal phase modulation of the pulse to be transmitted through the fiber.

It will be understood that many changes in the details, materials, steps and arrangements of parts, which have been herein described and illustrated in order to explain the nature of the invention, may be made by those skilled in the art without departing from the principles and scope of the present invention.

What is claimed is:

1. A fiber optic communication system comprising;
A laser having a gain section and a phase section, the phase section adapted to receive a binary base signal having a bit period T, the binary base signal modulating the phase section to generate a first signal having frequency modulation encoding the binary base signal; and
an optical spectrum reshaper (OSR) adapted to reshape the first signal into a second signal, wherein the second signal is amplitude modulated and frequency modulated.

2. The fiber optic communication system of claim 1, wherein the first signal includes frequency excursions from a base frequency to a peak frequency, the frequency excursions encoding the binary base signal; and wherein a frequency difference between the base and peak frequencies is substantially equal to from 0.25 and 0.75 times 1/T.

3. The fiber optic communication system of claim 1, wherein OSR has a 3 dB bandwidth between about 0.5 and two times 1/T.

4. The fiber optic communication system of claim 1, further comprising a driving circuit, the driving circuit being coupled to the phase section and gain section and configured to simultaneously modulate both the phase and gain sections such that the first signal is both frequency and amplitude modulated.

5. The fiber optic communication system of claim 1, further comprising an external reflector cavity in optical communication with the gain and phase sections.

6. The fiber optic communication system of claim 5, wherein the gain and phase sections are monolithically coupled to one another.

7. The fiber optic communication system of claim 5, wherein the external cavity comprises parallel resonator rings in optical communication with the gain section.

8. The fiber optic communication system of claim 5, wherein the external cavity comprises a multi-path ring resonator in optical communication with the gain section.

9. The fiber optic communication system of claim 5, wherein the external cavity comprises a triple coupler ring resonator in optical communication with the gain section.

10. The fiber optic communication system of claim 5, wherein the external cavity comprises a grating waveguide structure in optical communication with the gain section.

11. The fiber optic communication system of claim 1, wherein the laser is a distributed feedback laser.

12. The fiber optic communication system of claim 11, wherein the gain section comprises first and second subsections and wherein the phase section is positioned between the first and second gain sections.

13. The fiber optic communication system of claim 1, wherein the laser comprises a tunable twin guide sampled grating in optical communication with the gain section.

14. The fiber optic communication system of claim 1, wherein the laser comprises a tunable Y-branch reflector in optical communication with the gain section.

15. A method for encoding data in an optical signal comprising:
   applying a bias voltage to a gain section of a laser;
   modulating a phase section of the laser to generate a first signal having frequency modulating encoding binary data at a bit rate 1/T; and
   at least partially transforming the first signal into a second signal having frequency and amplitude modulation by transmitting the first signal through an optical spectrum reshaper.

16. The method of claim 15, wherein modulating the phase section comprises inducing modulation by means of at least one of (i) the quantum confined stark effect (QCSE), (ii) Pockels effect; and (iii) the Franz-Keldysh effect.

17. The method of claim 15, wherein the first signal includes frequency excursions from a base frequency to a peak frequency, the frequency excursions encoding the binary data; and wherein a frequency difference between the base and peak frequencies is substantially equal to from 0.25 and 0.75 times 1/T.

18. The method of claim 15, wherein the OSR has a 3 dB bandwidth greater than ½ times and less than two times 1/T.

19. The method of claim 15 further comprising simultaneously modulating both the phase and gain sections such that the first signal is both frequency and amplitude modulated.

20. The method of claim 15, wherein the laser comprises at least one of a tunable twin guide sampled grating (TTG-SG) distributed Bragg reflector (DBR) laser, a Y-branch laser, a tunable twin sampled grating (TT-SG), and an external cavity laser having at least one of parallel resonator rings, a multipath resonator, a triple coupler ring resonator, a grating wave guide structure, and an etalon filter.

\* \* \* \* \*